United States Patent [19]

Reichert et al.

[11] 4,202,001
[45] May 6, 1980

[54] SEMICONDUCTOR DEVICE HAVING GRID FOR PLATING CONTACTS

[75] Inventors: Walter F. Reichert, East Brunswick; Ho-Chung Huang, Princeton Junction, both of N.J.

[73] Assignee: RCA Corporation, New York, N.Y.

[21] Appl. No.: 903,121

[22] Filed: May 5, 1978

[51] Int. Cl.² .............. H01L 29/80; H01L 27/10; H01L 29/66

[52] U.S. Cl. .............................. 357/22; 357/42; 357/55; 357/68

[58] Field of Search ............... 357/22, 23, 42, 55, 357/71, 68

[56] References Cited

U.S. PATENT DOCUMENTS

| | | | |
|---|---|---|---|
| 3,484,662 | 12/1969 | Hagon | 357/22 |
| 3,749,985 | 7/1973 | Dawson | 357/23 |
| 3,790,825 | 2/1974 | Barron et al. | 357/22 |
| 3,894,295 | 7/1975 | Shannon et al. | 357/22 |
| 3,969,745 | 7/1976 | Blocker | 357/22 |
| 3,997,908 | 12/1976 | Schloetterer | 357/22 |
| 4,015,278 | 3/1977 | Fukuta | 357/22 |
| 4,038,563 | 7/1977 | Zuleeg et al. | 357/22 |
| 4,069,493 | 1/1978 | Bobenrieth | 357/22 |
| 4,084,173 | 4/1978 | Fantechi | 357/42 |
| 4,104,672 | 8/1978 | Dilorenzo et al. | 357/22 |

*Primary Examiner*—Andrew J. James
*Attorney, Agent, or Firm*—H. Christoffersen; D. S. Cohen

[57] ABSTRACT

A semiconductor device includes a body of semiconductor material on which are formed a plurality of spaced semiconductor elements. Each of the semiconductor elements includes a plurality of contacts, some of which are separated from each other by recesses in the semiconductor body. A metal grid is on the semiconductor body and surrounds each of the semiconductor elements. At least one of the contacts of each element extends to and is connected to the grid. The grid serves to electrically connect the contacts of all the semiconductor elements to permit the electrical plating of the contacts. Those contacts of each semiconductor element which are not directly connected to the grid are electrically connected thereto through the semiconductor body and an adjacent contact which is directly connected to the grid.

13 Claims, 5 Drawing Figures

SEMICONDUCTOR DEVICE HAVING GRID FOR PLATING CONTACTS

The invention herein disclosed was made in the course of or under a contract of subcontract thereunder with the Department of the Air Force.

The present invention relates to a semiconductor device construction which permits the electroplating of spaced contacts and particularly to such a construction which includes a grid for electrically connecting the contacts of a plurality of semiconductor elements on a single semiconductor body.

Most semiconductor elements are made by simultaneously forming a plurality of the elements on a single body or wafer of the semiconductor material. Depending on the size of the element itself and the size of the body or wafer, which may be 2 to 3 inches (5 to 7 cms) in diameter, there may be hundreds of the elements formed on the one body or wafer. After the elements are formed, the body or wafer is then broken or cut apart along lines extending between the elements to form the individual elements. Each of the elements generally includes two or more contacts which are coated with a conductive metal to permit ease of making electrical connection thereto. For certain types of conductive metals it is preferable to apply such metals by electroplating. To be able to electroplate all of the space contacts simultaneously it is necessary to electrically connect all of the space contacts to one side of the electroplating current supply. This is difficult since the contacts are so small and numerous. In making field effect transistors of the type shown in U.S. Pat. No. 3,764,865, to L. S. Napoli et al., issued Oct. 9, 1973, entitled, "SEMICONDUCTOR DEVICES HAVING CLOSELY SPACED CONTACTS", to electrically connect the contacts to a single electrical supply is even more difficult since in each element the source and drain contacts of the field effect transistor are physically separated by a groove in the semiconductor body and the gate contact is in the groove. Thus, the present invention relates to a semiconductor device construction, particularly for making field effect transistors of the type shown in U.S. Pat. No. 3,764,865 which permits electroplating all of the space contacts simultaneously.

Figure 1:
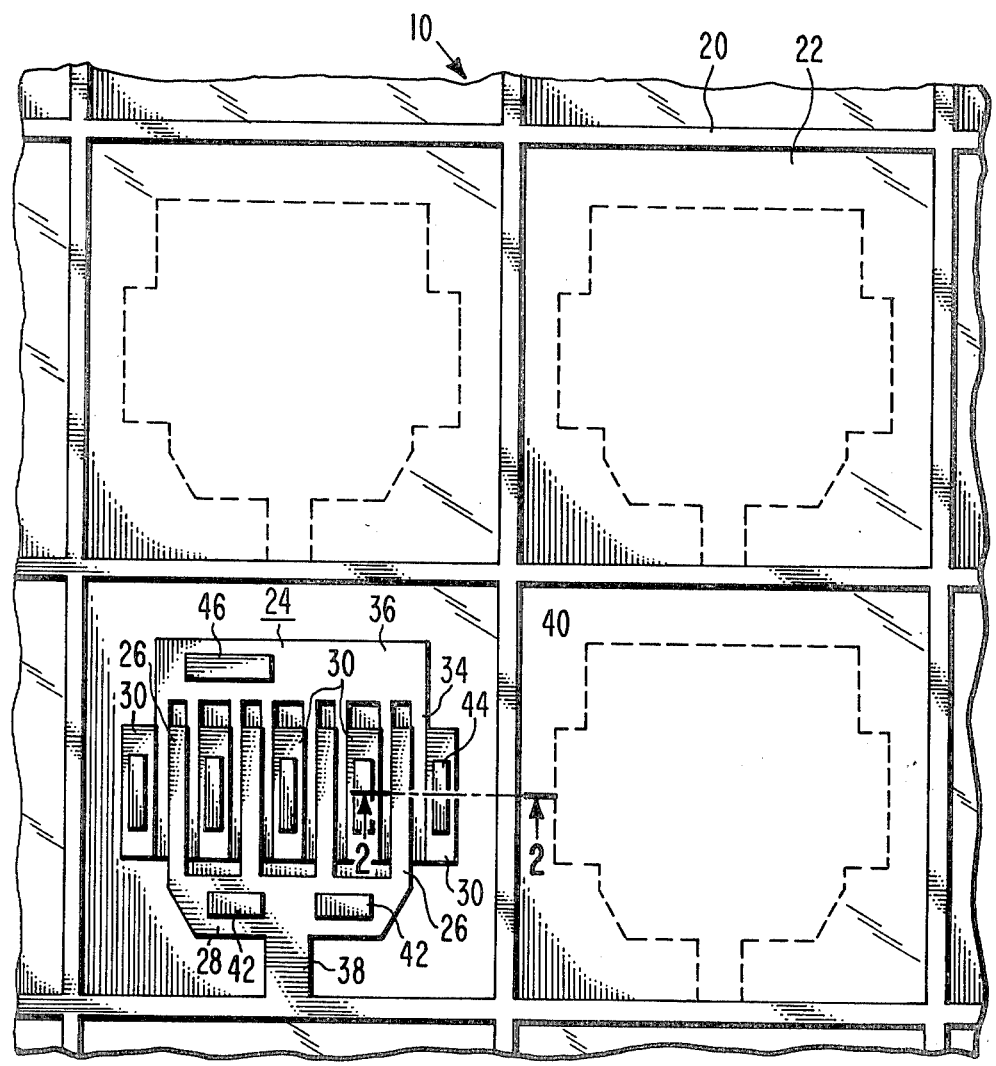
FIG. 1 is a top plan view of a portion of a semiconductor device embodying the present invention.
Figure 2:
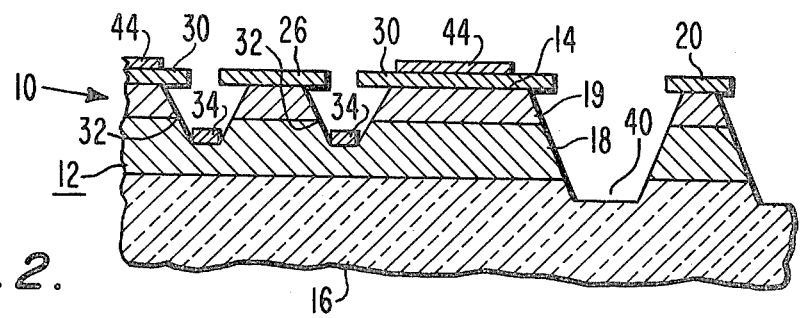
FIG. 2 is a sectional view taken along line 2—2 of FIG. 1.

Referring to the drawings, the semiconductor device of the present invention, generally designated as 10, includes a body 12 having a relatively flat surface 14. For making field effect transistors of the type shown in U.S. Pat. No. 3,764,865, the body 12 comprises a substrate 16 of an electrically insulating material having on a surface thereof a first epitaxial layer 18 of the semiconductor material of the desired conductivity type and a second epitaxial layer 19 of the same conductivity type as the first epitaxial layer but of a higher conductivity. The second epitaxial layer 19 provides the flat surface 14 of the body 12. The epitaxial layers 18 and 19 may be of any well known semiconductor material such as silicon, germanium or a Group III-V compound semiconductor material. The substrate 12 may be of any well known insulating material on which the particular semiconductor material of the first layer 18 can be epitaxially deposited. For example, the substrate 12 may be of sapphire, spinel or the same semiconductor material as the layer 18, but which is doped so as to have a very high resistance.

On the surface 14 of the body 12 is a grid 20 of an electrically conductive metal. As shown, the grid 20 is made up of two sets of narrow strips with the strips in each set being in spaced parallel relation and the strips in one set being orthogonal to the strips in the other set. Thus, the grid 20 divides the surface 14 into a plurality of rectangular areas 22. Within each of the areas 22 is a separate semiconductor element 24, which is shown to be a field effect transistor.

Each of the semiconductor elements 24 includes a plurality of spaced parallel drain contacts 26 on the surface 14 of the body 12. The drain contacts 26 extend from a conductive bus area 28 so that they are all electrically connected together. Along each side of each drain contact and spaced slightly therefrom are source contacts 30. Between each source contact 30 and its adjacent drain contact 26 is a groove 32 in the surface 14 of the body. The grooves 32 are of a depth to extend at least to and preferably into the first epitaxial layer 18. The open end of each of the grooves 32 is slightly wider than the spacing between the adjacent source and drain contacts 30 and 26 so that the source and drain contacts project slightly over the grooves. On the bottom surface of each of the grooves 32 is a gate contact 34. As shown in FIG. 1, the gate contacts 34 are electrically connected together by a bus 36 at the ends of the drain contacts 26 opposite the drain bus 28. A conductive connecting strip 38 extends along the surface 14 from the drain bus 28 to the grid 20. Thus, the drain contacts 26 are directly electrically connected to the grid 20.

A groove 40 is in the surface 14 between the grid 20 and the semiconductor element 24. The groove 40 extends around the semiconductor element except where the connected strip 38 extends to the grid 20. The groove 40 is of a depth to extend at least to and preferably into the substrate 16. The bus 36 which connects the gate contacts 34 is on the bottom of the groove 40. On the drain contact bus area 28, each of the source contacts 30 and the gate contact bus 36 are termination areas 42, 44 and 46 respectively, of a metal to which terminal wires can be easily connected.

Figure 3:
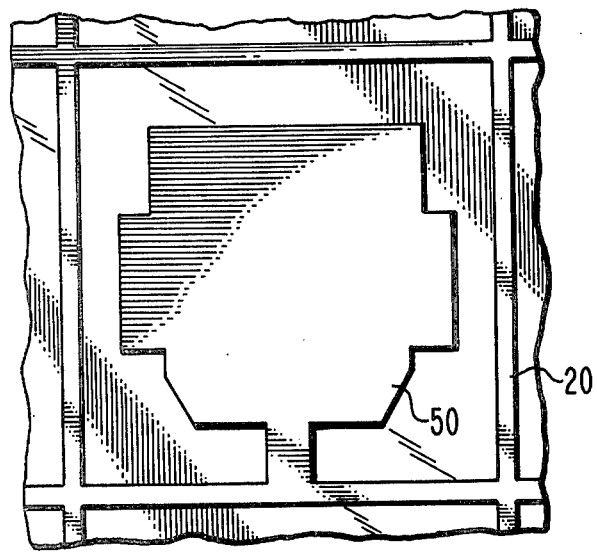
FIG. 3 is a top plan view showing the semiconductor device as it is being made.
Figure 4:
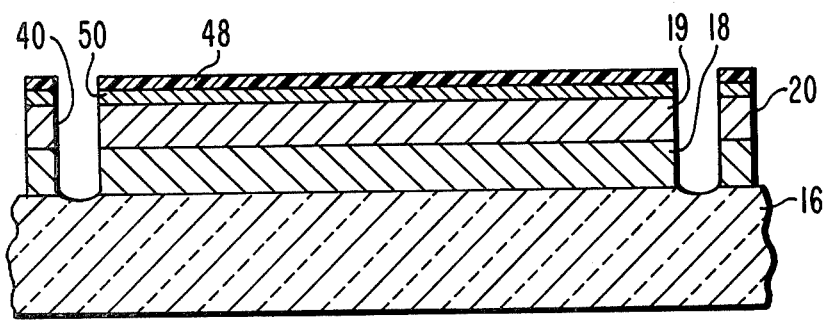
FIGS. 4 and 5 are sectional views illustrating further steps in the making of the semiconductor device.

Semiconductor device 10 is made by starting with a substrate 16 having the first and second epitaxial layers 18 and 19 thereon. The surface 14 is then coated, using any well known technique, with the metal for the drain and source contacts 26 and 30 and the grid 20. The metal should be one which makes good ohmic contact with the semiconductor material of the second epitaxial layer 19. The metal layer is then coated with a photoresist 48 which is defined using standard photolithographic techniques to cover the areas of the metal layer which will form the grid 20, and an area 50 which is the combined areas of the drain contacts 26, bus area 28, source contacts 30, and connecting strip 38, as shown in FIG. 3. The uncovered portions of the metal layer are then removed using a suitable etchant. This exposes the area of the surface 14 between the lines of the grid 20 and the remaining portion of the metal layer which will form the elements of the semiconductor element. As shown in FIG. 4, the groove 40 is then formed on the surface 14, preferably by ion milling.

Figure 5:
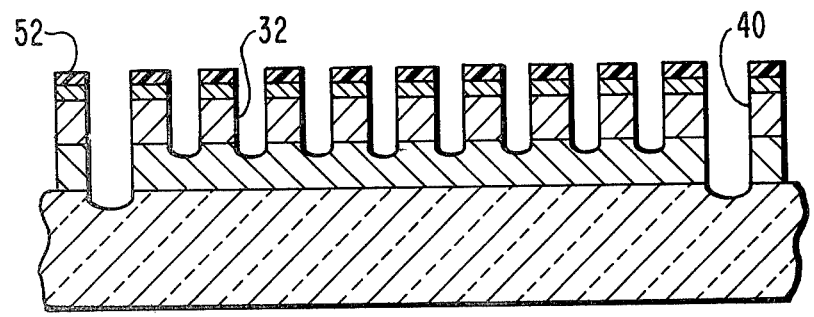

The photoresist 48 on the remaining metal layer is then removed and a new photoresist layer 52 (see FIG. 5) is applied thereto and defined using standard photolithographic techniques to cover the grid pattern, each of the drain contacts 26, the bus area 28, each of the source contacts 30 and the connecting strip 38, but exposing the areas of the metal film between the drain contacts 26 and source contacts 30. The exposed portions of the metal layer are then removed with a suitable etchant and the grooves 32 are formed in the surface 14 between the drain contacts 26 and source contacts 30. The grooves 32 are preferably formed by an initial ion milling followed by a chemical etching to etch the side walls of the grooves under the adjacent edges of the drain and source contacts 26 and 30. When the grooves 32 are ion milled and etched, the groove 40 will be further ion milled and etched to slightly increase its size.

The photoresist 52 on the metal layer is then removed and a metal film is coated on the bottom of the grooves 32 by the well known technique of evaporation in a vacuum. The edges of the drain and source contacts 26 and 30 serve as a mask to define the size of the metal film deposited on the bottom of the grooves 32 to form the gate contacts 34. The evaporated metal will also deposit on the bottom of the groove 40 as well as on the metal film on the surface 14. Using a photoresist protection layer and standard photolithographic techniques, all of the metal on the bottom of the groove 40 is removed except for the portion which forms the gate contact bus 36.

After removing the photoresist protection layer, all of the metal areas are now covered with a relatively thick layer of photoresist which is defined to form openings therethrough where the termination areas 42, 44 and 46 are to be provided. The grid 20 of the semiconductor device 10 is then electrically connected to one side of the electroplating power supply and the semiconductor device is immersed in a plating solution. Since the drain contact bus areas 28 are all directly electrically connected to the grid 20, the termination areas 42 on the drain contact bus areas will be directly electrically plated thereon. Although the source contacts 30 and the gate contact bus 36 are not directly electrically connected to the bus 20, they are electrically connected to the drain contacts through the epitaxial layers 18 and 19. The Schottky barrier between the gate contacts 34 and the epitaxial layer 18 is forward biased by the plating current so that the current will flow to the gate contact bus 32. Thus, the termination areas 44 and 46 on each of the source contacts 30 and the gate contact bus 36 will be plated simultaneously with the plating of the termination area 42 on the drain contact bus 28. Thus, by means of the grid 20 all of the termination areas on all of the semiconductor elements 24 are plated simultaneously. After the termination areas are plated, the photoresist layer is then removed and the semiconductor device is cut or broken along lines following the strips of the grid 20 to separate the semiconductor device into the individual semiconductor elements.

We claim:

1. A semiconductor device comprising:
   a body including a semiconductor material having a surface,
   a continuous metal grid on said surface and dividing said surface into a plurality of areas, with each area being surrounded by a portion of said grid
   a separate semiconductor element in each of said areas, each of said semiconductor elements including a plurality of contacts, and
   means on said surface electrically connecting at least one of said contacts of each of said semiconductor elements to said grid.

2. A semiconductor device in accordance with claim 1 in which in each of the areas there is a groove in the semiconductor material between at least two of said contacts.

3. A semiconductor device in accordance with claim 2 in which in each of the areas there is a groove in the semiconductor material between the grid and the semiconductor element and extending around the semiconductor element.

4. A semiconductor device in accordance with claim 3 in which the body includes a substrate of an electrical insulating material and at least one layer of the semiconductor material on the substrate, each of the grooves between the grid and the semiconductor element extends at least to the substrate at each of the grooves between the contacts and is of a depth less than the thickness of the semiconductor material.

5. A semiconductor device in accordance with claim 1 in which each of the semiconductor elements is a field effect transistor having spaced source and drain contacts and a gate contact between the source and drain contacts, and the means electrically connecting one of the contacts to the grid is connected to one of the source or drain contacts.

6. A semiconductor device in accordance with claim 5 in which each semiconductor element includes a groove in the semiconductor material between the source and drain contacts and the gate contact is on the bottom of the groove.

7. A semiconductor device in accordance with claim 6 in which in each area there is a groove in the semiconductor material between the grid and the semiconductor element and the groove extends around the semiconductor element.

8. A semiconductor device in accordance with claim 7 in which the body includes a substrate of an electrical insulating material and at least one layer of the semiconductor material on the substrate, each of the grooves between the grid and the semiconductor elements extends at least to the substrate and each of the grooves between the source and drain contacts is of a depth less than the thickness of the semiconductor material.

9. A semiconductor device in accordance with claim 5 in which each of the semiconductor elements includes a plurality of spaced drain contacts and a plurality of spaced source contacts with the source and drain contents being in alternating relation and a support gate contact between each source contact and its adjacent drain contact.

10. A semiconductor device in accordance with claim 9 in which each semiconductor element includes a separate groove between each source contact and its adjacent drain contact and the gate contacts are on the bottom of the grooves and a groove is in the semiconductor material between the grid and each semiconductor element.

11. A semiconductor device in accordance with claim 10 in which the drain contacts of each semiconductor element are electrically connected by a conductive bus on the surface of the semiconductor material and the means electrically connecting one of the contacts to the grid is connected to the drain contact bus.

12. A semiconductor device in accordance with claim 11 in which the body includes a substrate of an insulating material and at least one layer of the semiconductor material on the substrate, the grooves between the grid and the semiconductor elements extends at least to said substrate and the grooves between the source and drain contacts is of a depth less than the thickness of the semiconductor material.

13. A semiconductor device in accordance with claim 12 in which each semiconductor element includes a conductive bus on the bottom of the groove between the grid and the semiconductor element, which bus electrically connects all of the gate contacts of the semiconductor element.

* * * * *